United States Patent

Kingsley

[15] 3,698,076

[45] Oct. 17, 1972

[54] METHOD OF APPLYING LEADS TO AN INTEGRATED CIRCUIT

[72] Inventor: John T. Kingsley, Tempe, Ariz.

[73] Assignee: Motorola, Inc., Franklin Park, Ill.

[22] Filed: Aug. 3, 1970

[21] Appl. No.: 60,340

[52] U.S. Cl. ......................29/471.1, 29/423, 29/481, 29/493, 29/589, 156/249

[51] Int. Cl. ..............................................B23k 31/02

[58] Field of Search........29/590, 591, 589, 475, 480, 29/481, 471.1, 471.3, 423, 482, 493, 624, 628; 156/249; 174/DIG. 3; 317/234

[56] References Cited

UNITED STATES PATENTS

| | | | |
|---|---|---|---|
| 3,024,151 | 3/1962 | Robinson | 29/626 |
| 3,371,148 | 2/1968 | Roques et al. | 29/626 X |
| 3,374,537 | 3/1968 | Doelp, Jr. | 29/471.1 X |
| 3,428,933 | 2/1969 | Gerstenberger | 156/249 X |
| 3,440,027 | 4/1969 | Hugle | 29/627 X |
| 3,469,684 | 9/1969 | Keady et al. | 29/626 X |
| 3,544,857 | 12/1970 | Byrne et al. | 29/627 X |
| 3,550,945 | 12/1970 | Resnick | 156/249 X |
| 3,575,822 | 4/1971 | Lumbourg | 29/626 |
| 3,608,711 | 9/1971 | Wiesler et al. | 206/56 A |

*Primary Examiner*—John F. Campbell
*Assistant Examiner*—Richard Bernard Lazarus
*Attorney*—Mueller and Aichele

[57] ABSTRACT

In the process of applying leads to the bonding pads of an integrated circuit chip, after the lead portions of the first frame member are bonded to respective bonding pads on an integrated circuit, the first frame member is so contacted with the sticky side of an adhesive tape as to stick the first frame member and its leads to the tape. Then the part of the first frame member which is not to be used is cut away from the lead portions of the first frame member while the first frame member and its leads are still stuck to the tape. If desired, the resultant product, without further steps, may be put on a reel for sale or storage or for transportation to another work position, or respective leads of a second lead frame member may be bonded to the respective leads of the first frame member and the resultant product which includes the leads of the first frame member and the complete second frame member may be peeled from the tape and transported to storage or to another work position where the packaging of the integrated circuit may be completed.

5 Claims, 3 Drawing Figures

PATENTED OCT 17 1972 3,698,076

Figure 1:
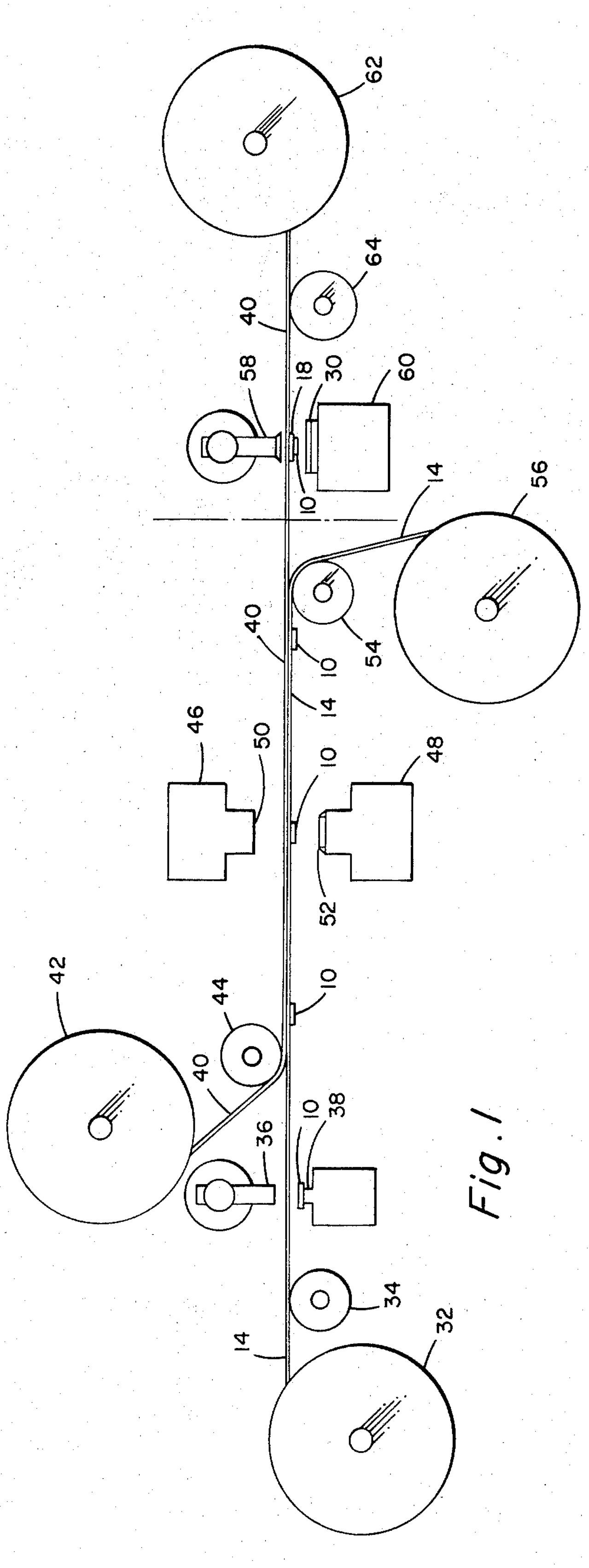

INVENTOR.
John T. Kingsley
BY
Mueller & Aichele
ATTY'S.

METHOD OF APPLYING LEADS TO AN INTEGRATED CIRCUIT

BACKGROUND

This invention relates to the method of applying leads to an integrated circuit.

In accordance with a process for applying leads to the bonding pads of an integrated circuit as disclosed in the Helda application Ser. No. 80,378 filing date Oct. 13, 1970, which is a continuation of an application by Helda, Ser. No. 691,041, filing date Dec. 15, 1967, and now abandoned, assigned to the assignee of this application, respective leads of a first frame member are applied to bonding pads of an integrated circuit, hereinafter called an IC or chip, and then, after this bonding step is accomplished, respective leads of the second frame are connected to leads of the first frame. The frame portion of the first frame is then torn away since the frame portion of the first frame short circuits the leads thereof and of anything is connected thereto. While the first lead frame is much thinner and much more flexible and has a lower tensile strength than the second lead frame, the process of tearing the excess portion of the first lead frame from the assembly comprising the chip and the first and second lead frames may cause breaking a bond from between the leads of the first and second lead frames or may tear a first lead from a bonding pad or may actually tear a lead of the first frame in such a manner as to destroy a connection to a bonding pad on the chip or may bend a lead of the second lead frame, making the product comprising the chip and the lead frames attached thereto worthless or hard to handle in further steps thereon.

The subject matter of this application is also related to that of pending applications owned by Motorola, Inc., the assignee of the present application, including the Helda-Geyer continuation application, Ser. No. 56,081, filed June 29, 1970, and Geyer-Helda application, Ser. No. 22,445, filed Mar. 25, 1970.

It is an object of this invention to provide an improved method of applying leads to chips.

It is an object of this invention to provide a method of applying leads to chips using a first and a second lead frame in which it is unnecessary to tear the frame portion of the first lead frame from the second lead frame.

SUMMARY

In accordance with this invention, the respective leads of the first lead frame are bonded in a known manner to the pads on a chip. Then a tape which is sticky on one side thereof is applied to the first lead frame. Then while the first lead frame and the chip which is bonded thereto is stuck to the sticky tape, the portions of the first lead frame that short circuit the frame are cut through, without cutting through the sticky tape, in such a manner that the part of the first lead frame which is not to be used is cut away from the remainder thereof. Then the part of the first frame that is not to be used is peeled away from the tape, leaving the lead part of the first frame stuck to the tape, with the chip bonding pads bonded to respective leads thereof. If desired, the tape having on it the lead portions of the first lead frame and the chips is wound on a reel for sale or for transport to another work position for applying the second frame. However, if desired, the respective leads of a second frame are bonded to the leads of the first frame and then the second frames, which may be supplied in the form of a strip thereof, are peeled away from the tape taking therewith the remaining portion of the leads of the first lead frame and the chip, and are taken to another work position to have other steps such as encapsulation performed thereon. The tape, now having nothing stuck thereto, may be reeled up to be discarded or, if it is usable, to be used again.

DESCRIPTION

Figure 2:
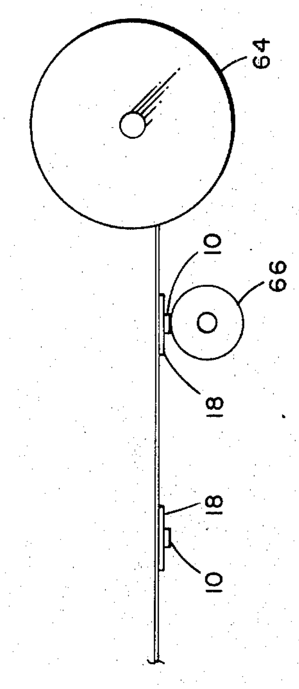
Figure 3:
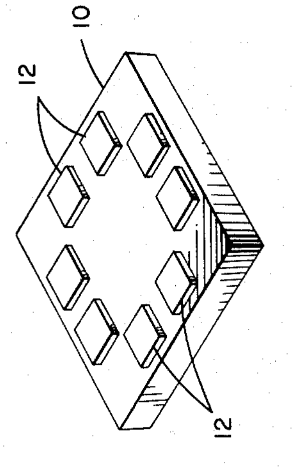

The invention will be better understood upon reading the following description in connection with the accompanying drawing in which FIG. 1 illustrates a machine with which the method of this invention may be performed, FIG. 2 illustrates a modification of this machine, FIG. 3 illustrates a chip which is an example of chips on which the method of this invention may be practiced, and FIGS. 4 to 7 illustrate the product after various steps in this method.

Turning first to FIG. 3, an IC or chip 10 on which the method of this invention may be practiced is shown. The chip 10 comprises a plurality, here 8, bonding pads 12 to which leads are to be fastened. The circuit on the chip is positioned thereon by any suitable method in the area between the pads 12. There may be more or less pads 12, 14 being a typical number. The tops of the pads 12 may be in the same plane and may be raised about 1 or 2 microns above the rest of the upper surface of the chip 10.

A fragmentary first lead frame 16 is shown to the left of FIG. 4 and a complete lead frame 16 including, however, the chip 10 having the inner ends of the leads 18 connected to the respective pads 12 is shown to the right of FIG. 4. While many types of frames may be used, the frame 14 of FIG. 4 includes indexing holes 20 whereby the strip 14 of material which includes the lead frame 16 may be moved one frame at a time in the process of bonding the inner ends of the leads 18 to the pads 12. The slots 22 are provided to equalize as much as possible the stiffness along its length of the strip 14. The material of the strip 14 is aluminum or copper and its thickness may be about 2 mils or less, whereby the frame 16 and the leads 18 thereof are very flexible.

The second frame 26 is shown in FIG. 7. The second frame may be of Kovar and may be about 10 mils thick whereby the inwardly extending leads thereof are stiff compared to the leads 18 of the frame 16. A lead 28 is aligned with a lead 18 and is bonded thereto as by compression bonding or soldering or welding in a known manner, all the leads 28 being bonded to respective leads 18 at the same time. The chip 10, the leads 18 and the inner portions of the leads 28 are to be packaged as by encapsulation and a portion of the frame 26 is cut away after packaging to electrically disconnect the various leads 28, to produce a packaged chip having external leads. Obviously, the externally extending leads for the package, which comprises the leads 28 and parts of the frame 26, extend far enough from the package (not shown) to produce a useful device, that is, the lengths of the leads 28 are not necessarily shown in their commercial proportions. The frames 26 are provided in the form of a strip 30, which may include any convenient number of frames 26 but which is not supplied on a reel due to the thickness and stiffness of the material of the strip 30.

Turning now to FIG. 1, a strip 14 of first frames 16 having inwardly extending unsupported ends 18 are provided on a storage reel 32. The strip 14 extends over a guide roll 34 and between a bonding post 36 and an anvil 38, a properly oriented chip 10 being positioned on the anvil 38. The chip 10 and the post 36 are brought together in such a manner as to bond the pads 12 of the chip 10 to the respective ends of leads 18 simultaneously. The pads 12 and the leads 18 are not shown in this part of FIG. 1, however, see FIGS. 4 and 5. The above-mentioned Helda application, or an application Ser. No. 22,446, filed Mar. 25, 1970, by Peter T. Robinson and assigned to the assignee of this application, may be looked to for means to bond the ends of leads 18 to the bonding pads 12. Next, the strip 14 having the chips 10 bonded to lead frames 16 thereof, as shown in FIGS. 4 and 5, is moved to the right as viewed in FIG. 1, and the back thereof, that is, the side away from the chip 10, is contacted with the sticky side of a tape 40, which is supplied from a tape supply reel 42. A roller 44 is provided to so guide the tape 40 that it properly contacts the strip 14. The relative position of the tape 40 and the strip 14 at the positions beyond the reel 44 is shown in FIG. 5. While the tape 40 is shown to be narrower than the strip 14, they may be of the same width or of any desired relative width as long as the leads 18 are supported by the tape 40.

Then, by cutting means 46 and 48, the frame 16 is severed along the length of the leads 18, however, the tape 40 is not severed. This is accomplished by making the working face 50 of the upper cutting means as illustrated in FIG. 1, that is, flat and smooth, and by putting cutting edges 52 on the upper or working face of the cutting means 48, the cutting edges 52 having a depth that permits cutting the strip 14 but not the tape 40. Then the strip 14, the middle of which is cut out, is peeled away from the tape 40 and runs over the guide roll 54 onto the reel 56 and may be sold for scrap or discarded. The spacial relationships of the tape 40 and the leads 18 and the chip 10 and its pads 12 with the remainder of the strip 14 pulled away therefrom is shown in FIG. 6. It will be noted that the several leads 18 are electrically separated from each other, except for their connection to the pads 12.

Then, if desired, a strip 30 of second frames 26 is fed at right angles but in a parallel plane to that of the tape 40 between an anvil 60 and an assembly comprising the chip 10 and the leads 18 attached thereto, the bonding post 58 being aligned with the anvil 60 but on the other side of the tape 40 from the strip 30. Points along the lead 18 are bonded to points along the leads 28 as shown in FIG. 7, and the assembly comprising the leads 18 and the chip 10 are peeled from the tape due to this bonding to the bonding frame 26 and subsequently thereto, and then the tape 40 is put on a reel 62 after going over a guide roll 64. This peeling of the tape 40 from the assembly of chip 10, first leads 18 and second lead frames 26 stress the several bonds made sufficiently to perform an important bond integrity test. If the tape 40 on the reel 62 is reusable, it may be reused, otherwise it may be discarded. If desired, however, the step of bonding the leads 28 of the second frame 26 to the leads 18 may be omitted, as shown in FIG. 2, and the tape 40 having the leads 18 stuck thereto and the chip 10 bonded to the leads 18 as noted above is rolled on to a storage reel 64 as with the assistance of a guide roll 66. The reel 64 and its contents may be sold as a finished product, if desired, or the reel 64 may be taken to another work position where other steps may be performed thereon. For example, long leads may be deposited on the tape 40 as by electrodeposition, the chip 10, the pads 12 and the inner ends of the leads 18 being masked off.

I claim:

1. In a method for the machine assembly of semiconductor devices utilizing in said method a plurality of semiconductor chips each having a plurality of contact pads thereon and two strips which are movable through the machine, one of said strips being of plastic which is imperforate in the body portion thereof and having adhesive on one side of such body position and one strip being of metal and having a plurality of spaced-apart groups of preformed leads in each group, the steps of moving the metal strip through said machine and securing a semiconductor chip to the inner end of each lead in a group of leads to provide an assembly of a chip and secured leads, repeating said securing step for a plurality of chips and corresponding groups of leads in the metal strip to provide a plurality of assemblies, moving said plastic strip in said machine and bringing the adhesive in engagement with one side of each lead-chip assembly and the corresponding side of the metal strip, separating in a severing action excess metal from the metal strip which is outside each group of leads in an assembly without perforating the plastic strip, removing from the machine the metal strip comprising the excess metal, and accumulating onto a supporting means the plastic strip with the plurality of lead-chip assemblies thereon whereby the supporting means may be independently handled with the plastic strip and assemblies therewith.

2. A method utilizing assembly apparatus for the fabrication of a plurality of semiconductor devices in a substantially continuous process which includes providing a plurality of semiconductor chips with contact pads thereon, providing a strip with adhesive on one side thereof and providing first and second metal strips each having a plurality of spaced-apart groups of leads preformed therein over the length thereof, each group of leads corresponding to the electrical connections required for a semiconductor device, moving said first metal strip through said apparatus, securing each of a plurality of chips at the contact pads thereof to corresponding leads in a group with said first metal strip, moving said adhesive strip into engagement on the adhesive side thereof with said first metal strip, said adhesive strip acting as a carrier for said first metal strip, severing from said first strip the excess metal outside the leads of each group while maintaining the leads and chip assembly with each group adhered to said adhesive and maintaining said excess metal in a continuous structure in said first metal strip, separating said excess metal continuous structure from said adhesive while said adhesive strip continues to be moved through said apparatus, moving said second metal strip into said apparatus and aligning the leads of a group in said second strip with the outer ends of the leads in a corresponding group in said first strip, securing together into a semiconductor device assembly the leads of respective groups in each the first and the second metal strips, and substantially coincidentally with said latter securing separating the adhesive strip and said first metal strip leads, and thereafter separating each semiconductor device assembly from said second strip.

3. The method as defined in claim 2 wherein said strip with adhesive on one side thereof and said first strip are pressed together and the leads in each group of said first strip are maintained in position by said adhesive on said strip, and in the step of severing said excess metal from said first strip, the metal is severed while maintaining said adhesive strip imperforate over the body portion thereof.

4. The method as defined in claim 3 wherein the strip having adhesive on one side is of flexible insulating material.

5. The method as defined in claim 2 wherein the adhesive strip and said first strip are each fed into the assembly apparatus from separate reels, and wherein the excess metal maintained as a strip and the adhesive strip are each respectively rewound on separate reels.

* * * * *